United States Patent
Lee

(10) Patent No.: US 6,410,414 B1
(45) Date of Patent: *Jun. 25, 2002

(54) METHOD FOR FABRICATING A SEMICONDUCTOR DEVICE

(75) Inventor: Joo-hern Lee, Seoul (KR)

(73) Assignee: Samsung Electronics Co., Ltd., Kyungki-do (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 9 days.

(21) Appl. No.: 09/416,403

(22) Filed: Oct. 12, 1999

(30) Foreign Application Priority Data

Dec. 28, 1998 (KR) ............................. 98-59417

(51) Int. Cl.[7] ............................. H01L 21/44
(52) U.S. Cl. ................. 438/612; 438/113; 438/462; 438/623
(58) Field of Search ................. 438/612, 113, 438/462, 613, 614, 623

(56) References Cited

U.S. PATENT DOCUMENTS

| 4,926,238 | A |   | 5/1990  | Mukai et al. ......... 357/72 |
|-----------|---|---|---------|------------------------------|
| 5,391,915 | A |   | 2/1995  | Mukai ............... 257/643 |
| 5,691,652 | A | * | 11/1997 | Miller, Jr. et al.           |
| 5,970,346 | A | * | 10/1999 | Liaw                         |
| 6,103,552 | A | * | 8/2000  | Lin                          |

* cited by examiner

Primary Examiner—Kevin M. Picardat
Assistant Examiner—D. M. Collins
(74) Attorney, Agent, or Firm—Skjerven Morrill MacPherson LLP; David W. Heid

(57) ABSTRACT

A method for fabricating a semiconductor device reduces soft errors, thereby enhancing reliability of the semiconductor device. In the method, a benzo cyclo butene (BCB) layer having a low water intake rate and an excellent blocking effect against alpha particles is formed between an alpha particle source such as a solder ball and sensitive integrated circuit devices such as a memory cell.

24 Claims, 4 Drawing Sheets

METHOD FOR FABRICATING A SEMICONDUCTOR DEVICE

BACKGROUND OF THE INVENTION

1. Field of the Invention

The present invention relates to semiconductor devices and methods for fabricating semiconductor devices, and more particularly, to packaging and fabrication methods that reduce soft errors in semiconductor devices including memory cells.

2. Description of the Related Art

Packaging protects semiconductor chips from the external environment. For example, in a plastic package, a molding compound encapsulates and protects a semiconductor chip from moisture and contaminants. However, the molding compound may contain radio active elements that can cause soft errors in the semiconductor chip. Soft errors correspond to the phenomenon where an alpha particle or other radiation enters a memory cell and changes the state of a data bit in the memory cell. Soft errors thus degrade the reliability of data stored in the semiconductor chip. Molding compounds usually contain elements that can emit alpha particles which can cause a soft error in a semiconductor chip. Accordingly, efforts have been made to reduce the content of alpha particle emitting elements in molding compounds. However, soft errors continue to be a concern for the semiconductor manufacturing industry as the integration level of semiconductor devices increases because the smaller feature sizes of devices in integrated circuits make alpha particles more effective at causing soft errors.

In addition to the reduction of alpha particle emitting elements in molding compounds, other methods have been suggested for preventing soft errors. For example, coating a polymer on the chip forms a layer that can block alpha particles. Also, modifying the layout of an integrated circuit can make a chip less susceptible to the alpha particles from the packaging structures.

Typically, a chip coating is a polyimide layer, which is approximately 10 $\mu$m or more thick, on a passivation layer of a semiconductor chip. The polyimide layer or coating reduces the energy of the alpha particles from the molding compound and other sources. U.S. Pat. No. 6,391,915, entitled "Integrated Circuit Having Reduced Soft Errors And Reduced Penetration Of Alkali Impurities Into The Substrate", which is incorporated here as reference in its entirety, discloses such coating technology.

In recent years, the physical and electrical limitations of plastic packages have driven the development of new package types. For example, a chip scale package (CSP) does not include the molding compound which is used for plastic packages. However, a CSP has solder bumps formed on the chip as external terminals of the CSP. The solder bumps typically include polonium (Po) as an impurity, and polonium emits alpha particles that can cause soft errors. The flux of the alpha particles from solder is greater than the alpha particle flux from the typical molding compound. Accordingly, conventional chip coatings cannot effectively prevent soft errors in CSPs and other similar semiconductor device packages.

SUMMARY OF THE INVENTION

To solve the above problems, an embodiment of the present invention provides a method for fabricating a semiconductor device that is capable of reducing soft errors. The method coats a chip with a material such as benzo cyclo butene (BCB) which has superior ability to block or slow alpha particles and has a low water intake rate when compared to a conventional polyimide layer.

According to one embodiment of the invention, a method for fabricating a semiconductor device, capable of reducing soft error, includes forming a top metal layer on a semiconductor substrate on which an integrated circuit including a memory cell is formed. Here, the top metal layer includes a bondpad. A passivation layer is on the top metal layer and patterned to expose the bondpad. A metal pattern is formed on the passivation layer and connected to the bondpad for bondpad redistribution, and an insulating layer including a benzo cyclo butene (BCB) layer is formed on the metal pattern.

The insulating layer can be a single BCB layer or can be composed of a BCB layer and a polyimide layer. In the latter case, either one of the BCB layer and the polyimide layer can be formed on the other. The effective thickness of the BCB layer for alpha particle suppression is 10 to 100 $\mu$m. The passivation layer commonly includes a layer selected from a group consisting of a silicon nitride (SiN) layer, a titanium nitride (TiN) layer, a plasma enhanced oxide (PEOX) layer and a phosphor-silicate glass (PSG) layer.

In alternative embodiments of the invention, the BCB layer can be between the metal pattern and the bondpad or incorporated between an upper passivation layer and a lower passivation layer.

The BCB layer hardly emits alpha particles and effectively blocks or slows alpha particles emitted from solder bumps that may be attached to the redistributed bonding pads, and thus the BCB layer reduces soft errors in the semiconductor chip. Additionally, since the BCB layer has a low moisture absorption ratio, moisture-related package problems also can be reduced.

BRIEF DESCRIPTION OF THE DRAWINGS

The features and advantages of the present invention will become more apparent from the following description of specific embodiments thereof with reference to the attached drawings in which.

DESCRIPTION OF THE PREFERRED EMBODIMENTS

FIGS. 1 through 4 show sectional views of structures formed during fabrication of a semiconductor device in accordance with an embodiment of the invention. The semiconductor device is resistant to soft errors that alpha particles otherwise cause. Referring to FIGS. 1 to 4, a method for manufacturing the semiconductor device is explained.

Figure 1:
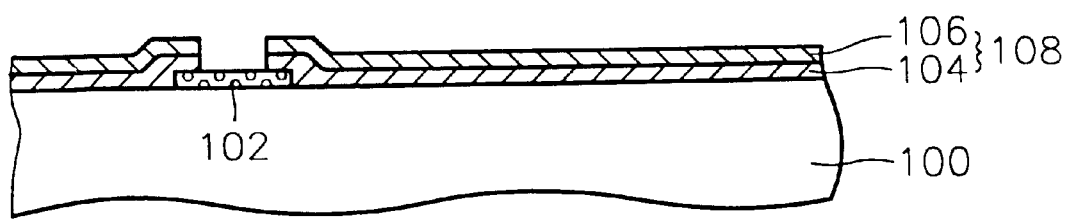
FIGS. 1 through 4 are partial sectional views of semiconductor structures illustrating a method for fabricating a semiconductor device according to an embodiment of the present invention.

FIG. 1 shows a semiconductor structure including bonding pads 102 formed on a semiconductor substrate 100. Semiconductor substrate 100 includes active regions (not shown) and layers (not shown) that form an integrated circuit connected to bonding pad 101. The integrated circuit typically includes a memory cell or other circuitry that is susceptible to soft errors. The processes for forming the integrated circuit up to forming bonding pads 102 are conventional and are not described in detail here.

Bonding pads 102 are typically aluminum and are portions of a metal pattern (not shown) layer formed on underlying integrated circuit layers (not shown). An overlying passivation layer 108 has openings that expose bonding pads 102 for subsequent electrical connections.

Passivation layer 108, which protects the integrated circuit layers from moisture and external impact, can be formed of a single or complex layer of a material such as silicon nitride (SiN), titanium nitride (TiN), plasma enhanced oxide (PEOX), or phosphor-silicate glass (PSG). In the embodiment shown, passivation layer 108 includes an upper passivation layer 106, which is an SiN layer or a PSG layer, and a lower passivation layer 104, which is a PEOX layer or a PSG layer. Known deposition and photolithography techniques can form passivation layer 108 with openings such that bonding pads 102 are exposed through passivation layer 108.

Figure 2:
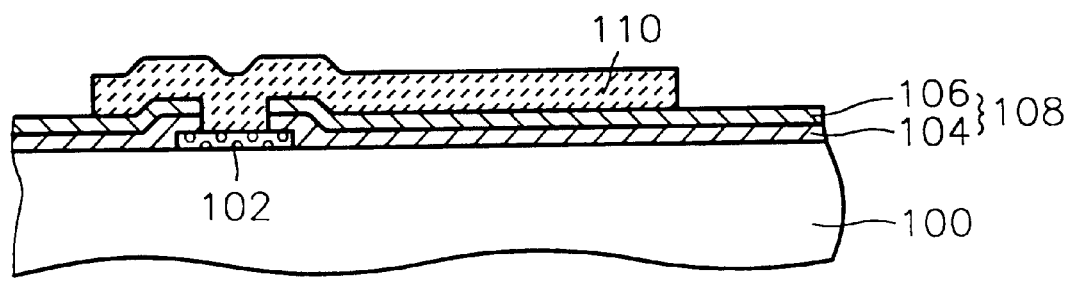

Referring to FIG. 2, known metal deposition and photolithography techniques form a metal pattern 110, i.e. a copper layer, on passivation layer 108 to redistribute bonding pads 102. The redistribution connects bonding pads 102 to external terminal pads 118 having a standardized external terminal format for the semiconductor device.

Figure 3:
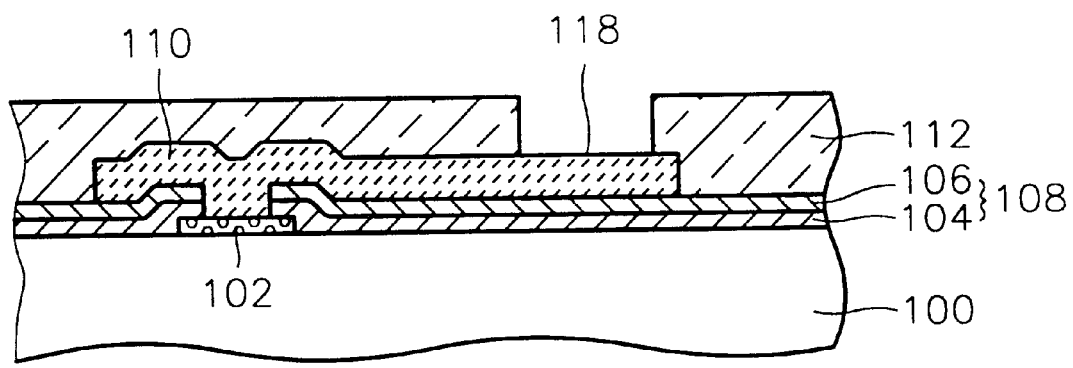

Referring to FIG. 3, a benzo cyclo butene (BCB) layer 112 is formed to a thickness of 10 μm to 100 μm on metal pattern 110 and passivation layer 108. Openings in BCB layer 112 expose portions of metal layer pattern 110 that correspond to external terminal pads 118.

To form benzo cyclo butene (BCB) layer 112, liquid benzo cyclo butene (BCB) is spin-coated on the entire surface of substrate 100 and cured at 270° C. for several minutes. Then known photolithography and etching processes expose external terminal pads 118, also referred to as ball pads 118. The glass transition temperature (Tg) of the BCB is approximately 60° C. higher than 290° C., which is the glass transition temperature (Tg) of polyimide. Thus, BCB layer 112 is more stable in packaging processes performed at a high-temperature. Photoresist is deposited on the BCB layer 112, and photolithography and etching pattern the photoresist and BCB layer 112 to expose external terminal pad 118 to which an external connector or terminal such as a solder ball is to be connected.

Figure 4:
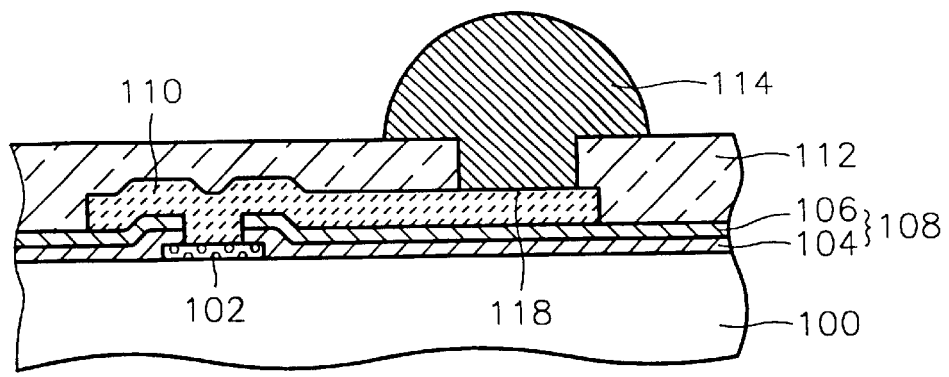

Referring to FIG. 4, a reflow method attaches solder balls to external terminal pads 118 to form external terminals 114 for a chip scale package (CSP) suitable for mounting on a printed circuit board (PCB). The type of connector and the method for connecting the connector to external terminal pads 118 may be modified according to the type of semiconductor package.

In a conventional semiconductor package, a material emitting a small flux of alpha particles, e.g., molding compound, may reside on the chip coating layer. However, advanced semiconductor packages such as CSPs or BGAs use solder balls or other package material that emits a relatively large flux of alpha particles when compared to the conventional molding compound. Thus, for advanced semiconductor packages such as shown in FIG. 4, BCB layer 112 is critical to reducing the probability that the alpha particles will affect a memory cell in the underlying integrated circuit.

TABLE 1

| Materials | Flux of Alpha Particles Emitted (CPH/cm$^2$) |
|---|---|
| Solder ball | 1.408 |
| Electroplated Solder | 0.17 |
| BCB Layer | not detected |
| Low Alpha Particle Molding Compound | 0.001 |
| Regular Molding Compound | 0.01 |

As mentioned above, solder balls emit more alpha particles than does the molding compound used in plastic packages. Table 1 shows the flux of alpha particles emitted from a solder ball, an electroplated solder, a BCB layer and two molding compounds as measured by a low level proportional counter (EG&G Berthold 770 type). In Table 1, the unit CPH/cm$^2$ indicates count per hour/cm$^2$.

As illustrated in Table 1, the relatively high flux from solder balls makes CSPs more vulnerable to soft errors than plastic packages. In particular, solder balls emit up to 140 times more alpha particles than molding compounds emit. However, BCB layer 112, which is 10 to 100 μm thick can suppress the large flux of alpha particles from the solder balls better than a polyimide layer could. In addition to the superior alpha particle blocking capability, the BCB layer has other favorable properties, as shown in Table 2.

TABLE 2

| material | dielectric constant (ε) | Tg (° C.) | moisture absorption ratio (%) |
|---|---|---|---|
| BCB | 2.56 | 350 | 0.2 |
| polyimide | 3.4 | 290 | 2.3 |

The BCB layer has a higher glass transition temperature and a lower moisture absorption ratio than the polyimide layer. Thus, the BCB layer may be more stable at an elevated temperature and can reduce moisture-related device problems.

Accelerated environment tests confirm the superiority of the BCB layer over a polyimide layer. The tests include an infrared (IR)-reflow test, a humidity absorption test and a temperature-cycle test. Two sets of semiconductor devices packaged in the same packages were tested; one with a BCB layer coated on a semiconductor chip and the other with a polyimide layer coated on a semiconductor chip. The three tests showed fewer moisture-related problems such as popcorn cracking and die pad corrosion and better thermal stability in the case of the BCB layer than in the case of the polyimide layer.

TABLE 3

| | 4M SRAM (with 10 μm thick polyimide layer) | | | | | | 4M SRAM (with 10 μm thick BCB layer) | | | | | |
|---|---|---|---|---|---|---|---|---|---|---|---|---|
| Vcc | 4.0 V | | 4.5 V | | 5.0 V | | 4.0 V | | 4.5 V | | 5.0 V | |
| cycle(ns) | 512 | 1024 | 512 | 1024 | 512 | 1024 | 512 | 1024 | 512 | 1024 | 512 | 1024 |
| sample #1 | 77 | 112 | 46 | 43 | 25 | 28 | 44 | 50 | 38 | 42 | 20 | 24 |
| sample #2 | 83 | 105 | 59 | 47 | 28 | 22 | 46 | 56 | 37 | 45 | 15 | 23 |
| sample #3 | 101 | 96 | 50 | 58 | 24 | 26 | 56 | 59 | 43 | 45 | 24 | 19 |
| sample #4 | 98 | 113 | 48 | 56 | 22 | 29 | 56 | 60 | 42 | 43 | 18 | 18 |
| sample #5 | 97 | 82 | 42 | 55 | 24 | 37 | 40 | 58 | 42 | 37 | 16 | 25 |
| sum of FIT | 654 | 727 | 357 | 375 | 184 | 209 | 350 | 410 | 256 | 308 | 141 | 162 |
| average of FIT | 91 | 102 | 49 | 52 | 25 | 28 | 48 | 57 | 36 | 42 | 19 | 22 |

Table 3 shows the frequency of soft errors in two sets of semiconductor devices. One set is 4M SRAM CSPs with 10 μm thick BCB layers as alpha particle blocking layer 112 of FIG. 4, and the other set is 4M SRAM CSPs with 10-μm thick polyimide layers as alpha particle blocking layer 112. 'FIT' (Failure In Time) indicates the frequency of soft errors when $10^9$ semiconductor devices are used for 1 hour. 'Cycle' indicates the time required for a set of writing and reading operations in a semiconductor device. Vcc is the power supply voltage during the writing and reading operation.

The CSPs with BCB layers resulted in lower soft error FIT than the CSPs with polyimide layers. For example, when Vcc is 4V and the cycle is 512 ns, the sum of FIT was 654 in the CSPs with polyimide layers, and 350 in the CSPs with BCB layers. That is, the BCB layer reduced the occurrence of soft errors by almost half. These test results indicate that a BCB layer more effectively blocks the alpha particles emitted from solder balls formed on CSP packages.

Figure 5:
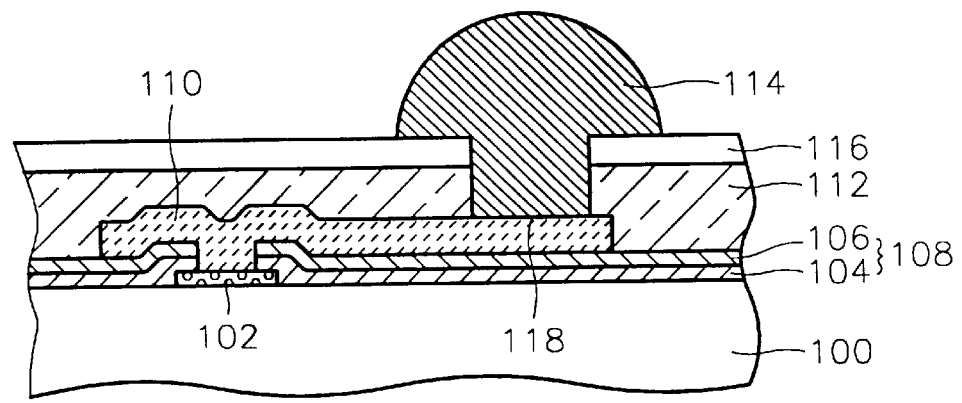
FIG. 5 is a partial sectional view of a semiconductor device according to another embodiment of the present invention.

Several variations of the embodiment described with FIGS. 1 to 4 are explained below. FIG. 5 is a sectional view illustrating a semiconductor device that differs from the device of FIG. 4 only in that a polyimide layer 116 is formed on BCB layer 112 before formation of solder balls 114. The fabrication process for the device of FIG. 5 includes forming metal pattern 110, BCB layer 112 and polyimide layer 116 in sequence. Then, patterning BCB layer 112 and polyimide layer 116 exposes external terminal pads 118. In this embodiment, both BCB layer 112 and polyimide layer 116 suppress penetration of the alpha particles from solder balls 114 into the underlying integrated circuit.

Figure 6:
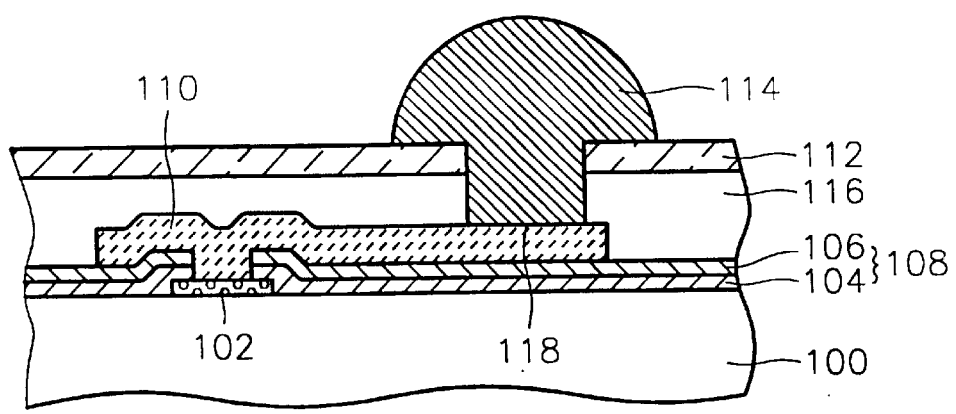
FIG. 6 is a partial sectional view of a semiconductor device according to yet another embodiment of the present invention.

FIG. 6 is a sectional view of a device where BCB layer 112 is on polyimide layer 116. A method for fabricating the semiconductor device of FIG. 6 includes forming polyimide layer 116 on metal pattern later 110 and then forming BCB layer 112 on polyimide layer 116. Patterning BCB layer 112 and polyimide layer 116 exposes external terminal pads 118. Again, both BCB layer 112 and polyimide layer 116 suppress penetration of the alpha particles from solder balls 114 into the underlying integrated circuit.

Figure 7:
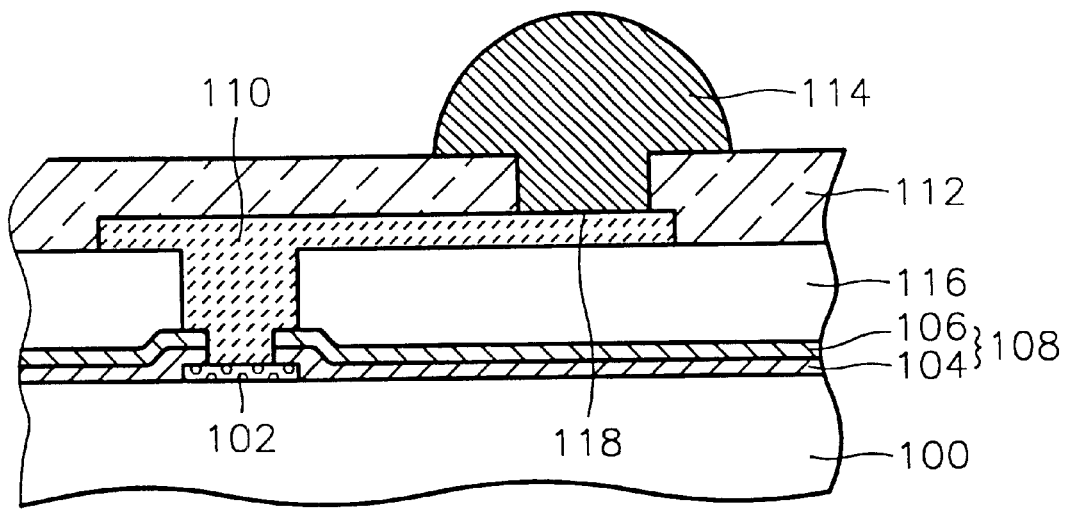
FIG. 7 is a partial sectional view of a semiconductor device according to still another embodiment of the present invention.

FIG. 7 is a sectional view illustrating a semiconductor device having polyimide layer 116 formed between metal pattern 110 and passivation layer 108. That is, after forming passivation layer 108, polyimide layer 116 is spin-coated on passivation layer 108 and bonding pads 102, and then patterned so as to expose bonding pads 102. Here, etching of passivation layer 108 and polyimide layer 116, for exposing the bondpad 102, may be performed using the same mask or using separate masks. Then, metal pattern 110 is deposited and patterned on polyimide layer 116, and BCB layer 112 is formed on metal pattern 110. This embodiment improves blocking of the alpha particles coming through or from external terminal pads 118 toward circuit patterns (not shown) under external terminal pads 118. As in the embodiments of FIGS. 5 and 6, both BCB layer 112 and polyimide layer 116 block the transmission of alpha particles emitted from the solder ball 114 into a memory cell (not shown) in and on semiconductor substrate 100.

Figure 8:
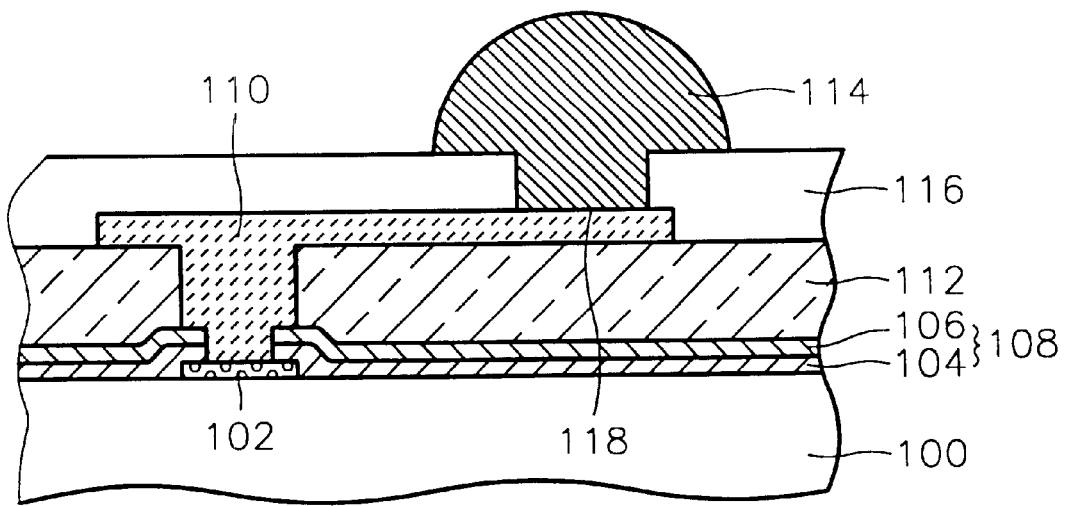
FIG. 8 is a partial sectional view of a semiconductor device according to another embodiment of the present invention.

FIG. 8 is a sectional view illustrating a semiconductor device that differs from the embodiment of FIG. 5, in that BCB layer 112 is between metal pattern 110 and passivation layer 108. That is, after forming passivation layer 108, BCB layer 112 is spin-coated on passivation layer 108 and bonding pads 102 and then patterned to expose bonding pads 102. Again BCB layer 112 and passivation layer 108 can be patterned using separate masks or using the same mask. Then, metal pattern 110 is formed on BCB layer 112, and polyimide layer 116 is formed on metal pattern 110. Like the embodiment of FIG. 7, this embodiment also effectively blocks alpha particles emitted through or from external terminal pads 118 toward circuit patterns (not shown) under external terminal pads 118.

Figure 9:
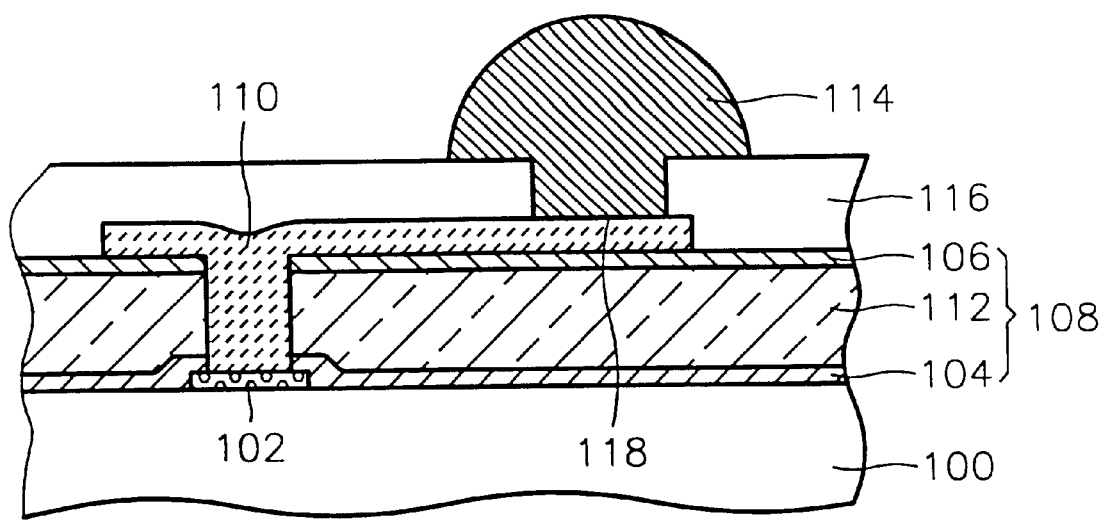
FIG. 9 is a partial sectional view of a semiconductor device according to another embodiment of the present invention.

FIG. 9 is a sectional view illustrating a semiconductor device having BCB layer 112 between upper passivation layer 106 and lower passivation layer 104. Polyimide layer 116 overlies metal pattern 110 and passivation layer 108, which includes upper passivation layer 106, BCB layer 112, and lower passivation layer 104. A known spin-coating method can form BCB layer 112 on lower passivation layer 104, and upper passivation layer 106 is formed on BCB layer 112. All three layers 104, 112, and 106 can be etched using the same mask layer to expose bonding pad 102. Alternatively, separate masks can be employed for patterning layers 104, 112, and 106. Like the embodiments of FIGS. 7 and 8, this embodiment also effectively blocks the alpha particles emitted through or from external terminal pads 118 toward circuit patterns (not shown) under external terminal pads 118. Here, in an exemplary embodiment, passivation layer 108 has a multiple-layered structure with a first layer 104 made of SiN or TiN and a third layer 106 formed of PSG or PEOX, and a second layer 112 made of BCB is between the first and third layers 104 and 106.

As described above, alpha particles emitted from the packaging material into an internal memory cell of a semiconductor chip are blocked by a BCB layer. As a result, soft errors can be suppressed. Further, the BCB layer has the inherent physical characteristics, e.g., a low water intake rate, that reduce defects caused by corrosion occurring in the semiconductor package. Accordingly, the BCB layer enhances the reliability of a semiconductor package. Further, the BCB layer has a good high temperature stability when compared to the conventional chip coating materials, and damage at high temperature can be reduced. Still further, the BCB layer has low volatility and does not cause corrosive byproducts during curing, and the overall fabrication can stably be performed.

Although the invention has been described with reference to particular embodiments, the description is only an example of the inventor's application and should not be taken as a limitation. Various adaptations and combinations of features of the embodiments disclosed are within the scope of the invention as defined by the following claims.

What is claimed is:

1. A method for fabricating a semiconductor device, comprising:
   (a) forming a top metal layer including a bondpad on an integrated circuit including a memory cell;
   (b) forming a passivation layer on the top metal layer, for preventing penetration of moisture or impurities;
   (c) pattering the passivation layer to expose the bondpad;
   (d) forming a metal pattern on the passivation layer connected to the bondpad for bondpad redistribution; and
   (e) forming a plurality of insulating layers including a benzo cyclo butene (BCB) layer and a polymer layer on the metal pattern.

2. The method of claim 1, wherein forming the plurality of insulating layers comprises:
   forming the BCB layer on the metal pattern; and
   forming a polyimide layer on the BCB layer.

3. The method of claim 1, wherein forming the plurality of insulating layers comprises:
   forming a polyimide layer on the metal pattern; and
   forming the BCB layer on the polyimide layer.

4. The method of claim 1, wherein the passivation layer comprises at least one layer selected from a group consisting of a silicon nitride (SiN) layer, a titanium nitride (TiN) layer, a plasma enhanced oxide (PEOX) layer and a phosphor-silicate glass (PSG) layer.

5. The method of claim 1, wherein the BCB layer has a thickness between 10 $\mu$m and 100 $\mu$m.

6. The method of claim 1, further comprising connecting an external connecting means to the metal pattern after forming the insulating layer.

7. A method for fabricating a semiconductor device, comprising:
   (a) forming a top metal layer including a bondpad on an integrated circuit including a memory cell;
   (b) forming a passivation layer on the top metal layer, for preventing penetration of moisture or impurities;
   (c) forming a first insulating layer on the passivation layer;
   (d) patterning the first insulating layer to expose the bondpad;
   (e) forming a metal pattern on the first insulating layer connected to the bondpad for bondpad redistribution; and
   (f) forming a second insulating layer including a benzo cyclo butene (BCB) layer on the metal pattern for bondpad redistribution.

8. The method of claim 7, further comprising patterning the passivation layer to expose the bondpad after the step (b).

9. The method of claim 7, wherein the passivation layer comprises at least one layer selected from a group consisting of a silicon nitride (SiN) layer, a titanium nitride (TiN) layer, a plasma enhanced oxide (PEOX) layer and a phosphor-silicate glass (PSG) layer.

10. The method of claim 7, wherein the BCB layer has a thickness between 10 $\mu$m and 100 $\mu$m.

11. The method of claim 7, further comprising connecting an external connecting means to the metal pattern after the step (f).

12. The method of claim 7, wherein the first insulating layer comprises a polyimide layer.

13. A method for fabricating a semiconductor device, comprising:
   (a) forming a top metal layer including a bondpad on an integrated circuit including a memory cell;
   (b) forming a passivation layer on the top metal layer, for preventing penetration of moisture or impurities;
   (c) forming a first insulating layer including a benzo cyclo butene (BCB) layer on the passivation layer;
   (d) patterning the first insulating layer to expose the bondpad;
   (e) forming a metal pattern on the first insulating layer connected to the bondpad for bondpad redistribution; and
   (f) forming a second insulating layer on the metal pattern.

14. The method of claim 13, further comprising patterning the passivation layer to expose the bondpad after the step (b).

15. The method of claim 13, wherein the passivation layer comprises at least one layer selected from a group consisting of a silicon nitride (SiN) layer, a titanium nitride (TiN) layer, a plasma enhanced oxide (PEOX) layer and a phosphor-silicate glass (PSG) layer.

16. The method of claim 13, wherein the BCB layer has a thickness between 10 $\mu$m and 100 $\mu$m.

17. The method of claim 13, further comprising connecting an external connecting means to the metal pattern after the step (f).

18. The method of claim 13, wherein the second insulating layer comprises a polyimide layer.

19. A method for fabricating semiconductor device comprising:
   (a) forming a top metal layer on a semiconductor substrate on which an integrated circuit is formed;
   (b) forming a passivation layer on the top metal layer, the passivation layer multiple layers one of which is a benzo cyclo butene layer;
   (c) patterning the passivation layer to expose the bondpad;
   (d) forming a metal pattern for bondpad redistribution connected to the bondpad; and
   (e) forming an insulating layer on the metal pattern.

20. The method of claim 19, further comprising connecting an external connecting means to the metal pattern after the step (e).

21. The method of claim 19, wherein the BCB layer has a thickness between 10 $\mu$m and 100 $\mu$m.

22. The method of claim 19, wherein forming the passivation layer comprises:
   forming a first layer of silicon nitride (SiN) or titanium nitride (TiN);
   forming a second layer of BCB; and
   forming a third layer of phosphor-silicate glass (PSG) or plasma enhanced oxide (PEOX).

23. The method of claim 22, wherein the second layer is between the first and third layers.

24. The method of claim 19, wherein the insulating layer is formed of polyimide.

* * * * *